(12) United States Patent
Andricacos et al.

(10) Patent No.: US 6,268,291 B1
(45) Date of Patent: Jul. 31, 2001

(54) METHOD FOR FORMING ELECTROMIGRATION-RESISTANT STRUCTURES BY DOPING

(75) Inventors: Panayotis Constantinou Andricacos, Croton-on-Hudson; Cyril Cabral, Jr., Ossining; Christopher Carr Parks, Beacon; Kenneth Parker Rodbell, Poughguag; Roger Yen-Luen Tsai, Yorktown Heights, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/204,185

(22) Filed: Dec. 3, 1998

(51) Int. Cl.$^7$ ................................................. H01L 21/00
(52) U.S. Cl. .......................... 438/694; 438/687; 438/689
(58) Field of Search ................................... 438/687, 660, 438/688, 837, 627, 648, 633, 641, 661, 643, 689–694; 216/17, 18

(56) References Cited

U.S. PATENT DOCUMENTS

| | | | |
|---|---|---|---|
| 5,130,779 | * | 7/1992 | Agarwala et al. ................. 357/67 |
| 5,251,806 | * | 10/1993 | Agarwala et al . ............. 228/180.22 |
| 5,892,282 | * | 4/1999 | Hong et al. ........................ 257/751 |
| 5,930,669 | * | 7/1999 | Uzoh .................................. 438/627 |
| 5,985,763 | * | 11/1999 | Hong et al. ........................ 438/688 |
| 6,022,808 | * | 2/2000 | Nogami et al. .................... 438/694 |
| 6,037,257 | * | 2/2000 | Chiang et al. ..................... 438/687 |

FOREIGN PATENT DOCUMENTS

| | | | |
|---|---|---|---|
| 56-018443 | * | 11/1981 | (JP) .......................................... 21/88 |
| 56-148843 | * | 11/1981 | (JP) .......................................... 21/88 |
| 61-131829 | | 8/1986 | (JP) . |
| 1-102940 | | 4/1989 | (JP) . |
| 2-113552 | | 4/1990 | (JP) . |
| 3-120722 | | 5/1991 | (JP) . |
| 3-211734 | | 9/1991 | (JP) . |
| 6-163706 | | 6/1994 | (JP) . |
| 6-318595 | | 11/1994 | (JP) . |

(List continued on next page.)

Primary Examiner—Charles Q. Bowers, Jr.
Assistant Examiner—Laura Schillinger
(74) Attorney, Agent, or Firm—Robert M. Trepp; Randy W. Tung

(57) ABSTRACT

A method for forming a copper conductor in an electronic structure by first depositing a copper composition in a receptacle formed in the electronic structure, and then adding impurities into the copper composition such that its electromigration resistance is improved is disclosed. In the method, the copper composition can be deposited by a variety of techniques such as electroplating, physical vapor deposition and chemical vapor deposition. The impurities which can be implanted include those of C, O, Cl, S and N at a suitable concentration range between about 0.01 ppm by weight and about 1000 ppm by weight. The impurities can be added by three different methods. In the first method, a copper seed layer is first deposited into a receptacle and an ion implantation process is carried out on the seed layer, which is followed by electroplating copper into the receptacle. In the second method, a copper seed layer is first deposited into a receptacle, a copper composition containing impurities is then electrodeposited into the receptacle and the electronic structure is annealed so that impurities diffuse into the copper seed layer. In the third method, a barrier layer is first deposited into a receptacle, dopant ions are then implanted into the barrier layer with a copper seed layer subsequently deposited on top of the barrier layer. An annealing process for the electronic structure is then carried out such that dopant ions diffuse into the copper seed layer. The present invention method may further include the step of ion-implanting at least one element into a surface layer of the copper conductor after the conductor is first planarized. The surface layer may have a thickness between about 30 Å and about 500 Å. At least one element may be selected from Co, Al, Sn, In, Ti and Cr.

32 Claims, 4 Drawing Sheets

FOREIGN PATENT DOCUMENTS 8-204013    8/1996   (JP).
10-199884   7/1998   (JP).

* cited by examiner

METHOD FOR FORMING ELECTROMIGRATION-RESISTANT STRUCTURES BY DOPING

CROSS-REFERENCE TO RELATED APPLICATION

This application is cross-referenced to Ser. No. 08/768,107, filed Dec. 16, 1996, by P. C. Andricacos et al, which is directed to electroplated Cu wiring on integrated circuit chips.

This application is cross-referenced to Ser. No. 09/067,851, filed Apr. 27, 1998, by A. Simon et al, which is directed to a copper interconnection structure for metal wiring on integrated circuit chips incorporating a copper alloy seed layer.

FIELD OF THE INVENTION

The present invention generally relates to a method for forming a copper conductor in an electronic structure and structures formed by such method and more particularly, relates to a method for forming a copper conductor that has improved electromigration resistance by incorporating dopant ions into the conductor and structures formed by such method.

BACKGROUND OF THE INVENTION

The technology of making metal conductors to provide for vias, lines and other recesses in semiconductor chip structures, flat panel displays and package applications has been developed in the past decade. For instance, in developing interconnection technology for very-large-scale-integrated (VLSI) structures, aluminum has been utilized as the primary metal source for contacts and interconnects in semiconductor regions or devices located on a single substrate. Aluminum has been the material of choice because of its low cost, good ohmic contact and high conductivity. However, pure aluminum thin-film conductors have undesirable properties such as a low melting point which limits its use to low temperature processing possible diffusion into the silicon during annealing which leads to contact and junction failure, and poor electromigration resistance. Consequently, a number of aluminum alloys have been developed which provided advances over pure aluminum. For instance, U.S. Pat. No. 4,566,177 discloses a conductive layer of an alloy of aluminum containing up to 3% by weight of silicon, copper, nickel, chromium and manganese developed to improve electromigration resistance. U.S. Pat. No. 3,631,304 discloses aluminum alloys with aluminum oxide which were also used to improve electromigration resistance.

Recently developed ULSI technology has placed more stringent demands on the wiring requirements due to the extremely high circuit densities and faster operating speeds required of such devices. This leads to higher current densities in increasingly smaller conductor lines. As a result, higher conductance wiring is desired which requires either larger cross-section wires for aluminum alloy conductors or a different wiring material that has a higher conductance. The obvious choice in the industry is to develop the latter which includes pure copper for its desirable high conductivity.

In the formation of ULSI interconnection structures such as vias and lines, copper can be deposited into such recesses to interconnect semiconductor regions or devices located on the same substrate. However, copper is known to have problems in semiconductor devices. Since copper is a mid-level trap which degrades the device. The electromigration phenomenon occurs when the superposition of an electric field onto random thermal diffusion in a metallic solid causes a net drift of ions in the direction of the electron flow. Any diffusion of copper ions into the silicon substrate can cause device failure. In addition, pure copper does not adhere well to oxygen-containing dielectrics such as silicon dioxide and polyimide. To fully utilize copper in interconnection technology, the adhesion properties of copper must also be improved.

U.S. Pat. No. 5,130,274, assigned to the common assignee of the present invention, discloses the use of a copper alloy containing an alloying element of less than 2 atomic % by first depositing an alloy into the recess of an interconnection structure and then forming a copper alloy plug. However, the technique still does not satisfy the more stringent requirements in ULSI structures where critical dimensions of less than 0.5 μm place a considerable burden on thin film chip interconnections. The use of standard Al (Cu) alloy and a silicon dioxide dielectric in a deep-submicron logic circuit wiring structure results in a large circuit delay caused mainly by the wiring connections.

The use of Cu as an alternative material to Al (Cu) in ULSI wiring structures to increase the chip speed has been attempted by others. However, numerous problems are incurred in Cu interconnections such as the tendency of Cu to corrode and the fast surface diffusion rates of copper in thin films. It is known that pure Cu has a smaller electromigration activation energy, i.e., 0.5~0.8 eV, than that in Al (Cu) of 0.80~0.9 eV. This implies that the advantage of using Cu for reducing interconnection electromigration failure at chip operating conditions is largely compromised.

A schematic of an enlarged, cross-sectional view of an electronic structure that utilizes conventional interconnections made of a copper alloy is shown in FIG. 1. The electronic structure 10 contains two levels of copper interconnections 12, 16 and one stud level 14 illustrating a copper wiring structure formed in a Damascene process on a pre-fabricated device 20. The device 20 is built on a semi-conducting substrate 24. As shown in FIG. 1, a typical Damascene level is first fabricated by the deposition of a planar dielectric stack 26. The dielectric stack 26 is then patterned and etched using standard lithographic and dry etch techniques to produce a desired wiring or via pattern. The process is then followed by the metal depositions of a thin adhesion/diffusion liner 18 and copper alloy metallurgy 12 wherein a bottom silicon nitride layer 28 is used as a diffusion barrier which is previously deposited on top of the device 20 to protect against copper diffusion. After the copper alloy interconnection 12 is formed, a top silicon nitride layer 32 is deposited and used as an etch stop layer for defining the next level copper interconnection 14. After a second level dielectric stack 34 is deposited, a recess for an interconnect is etched into the dielectric layer 34 and the silicon nitride layer 32.

A interlevel copper alloy stud 14 with liner 22 is then deposited by a technique similar to that used in depositing the first level copper alloy interconnection 12. A variety of metal deposition techniques can be used for filling the trench or via. These techniques include a collimated sputtering process, an ion cluster beam process, an electron cyclotron resonance process, a chemical vapor deposition process, an electroless plating process and an electrolytic plating process. Other techniques such as a co-deposition method in which copper and an alloying element are co-deposited can also be used in forming the copper alloys. For instance, the co-deposition methods include co-sputtering, "alloy plating", sequential plating of different materials with subsequent annealing, chemical vapor deposition, sequential chemical vapor deposition and co-evaporation. After the completion of the interlevel copper alloy stud 14, another similar process is repeated to form the second level copper interconnection 16 with liner 24 in a third dielectric stack layer 38. An etch stop layer 36 of silicon nitride is utilized between the stud and the second level interconnections. Finally, a top silicon nitride layer 42 is deposited on top of the copper wiring structure 10 for protecting the device from the environment.

Other workers have attempted to use copper alloys in providing enhanced electromigration resistance. For instance, U.S. Pat. No. 5,023,698 teaches copper alloys containing at least one alloying element selected from the group of Al, Be, Cr, Fe, Mg, Ni, Si, Sn and Zn. U.S. Pat. No. 5,077,005 teaches copper alloys containing at least one member selected from In, Cd, Sb, Bi, Ti, Ag, Sn, Pb, Zr and Hf where the weight percent of the alloying element used is between 0.0003 to 0.01. The copper alloys are used in TAB processes and as print circuit board members. U.S. Pat. No. 5,004,520 also teaches copper foil for a film carrier application containing at least one alloying element selected from P, Al, Cd, Fe, Mg, Ni, Sn, Ag, Hf, Zn, B, As, Co, In, Mn, Si, Te, Cr and Zn with the alloying element concentrations from 0.03 to 0.5 weight percent. The alloys are used as connecting leads in integrated circuit chip mounting. Furthermore, U.S. Pat. No. 4,749,548 teaches copper alloys containing at least one alloying element selected from Cr, Zr, Li, P, Mg, Si, Al, Zn, Mn, Ni, Sn, Ti, Be, Fe, Co, Y, Ce, La, Nb, W, V, Ta, B, Hf, Mo and C. The alloying elements are used to increase the strength of the copper alloy. U.S. Pat. Nos. 5,243,222 and 5,130,274 teach copper alloys for improved adhesion and formation of diffusion barriers. However, none of these prior work teaches copper alloys that are sufficiently improved for use in ULSI on-chip or off-chip wiring interconnections to meet the electromigration resistance and the adhesion property requirements. Interconnection structures on ULSI devices must provide dense, fully continuous metal wiring in insulator structures with features much less than 0.5 $\mu$m in width, and with aspect ratios higher than 1.

More recently, void-free and seamless conductors are produced by electroplating copper from plating baths that contain additives. The capability of the electroplating method to superfill structural features without leaving voids or seams is unique and superior to that of other deposition techniques.

Electrolytic copper plating techniques used in damascene structures can be defect-free if a seed layer deposited is continuous and has a uniform thickness even in the deepest area of the structural feature to be plated. The copper seed layer is typically deposited by a physical vapor deposition technique or a sputtering technique over a barrier layer that prevents diffusion of copper into the insulator such as Ta or TaN. When the seed layer deposited is too thin at the bottom or near-bottom walls of a structural feature, plating does not occur and a void is created.

In order to eliminate the non-continuous deposition problem occurring during sputtering of a copper seed layer, a seed layer of a larger thickness is normally deposited. The deposition of a thick seed layer eliminates the plated Cu voiding problem, however, it creates another one of equal or even greater significance, i.e., poor electromigration resistance in the resultant structure. The poor electromigration resistance of the structure is caused by the fact that the seed layer itself has weak electromigration resistance when compared to the much higher resistance of the plated film. It is also noted that in future generation of chips, the seed layer contributes an increasing part of the total structure based on the dimensions of the features and the inability to decrease the thickness of the seed layer proportionally for reason stated above as well as the thickness uniformity requirements in electrolytic plating.

Ion implantation method has been used for placing impurity, or doping ions in a semiconductor material such as in a silicon substrate at precisely controlled depths and with accurate control of dopant ion concentration. One of the major benefits of the method is its capability to precisely place ions at preselected locations and at predetermined dosage. It is a very reproducible process that enables a high level of dopant uniformity. For instance, a typical variation of less than 1% can be obtained across a wafer.

An ion implanter operates by providing an ion source wherein collisions of electrons and neutral atoms result in a large number of ions being produced. The ions required for doping are then selected by an analyzing magnet and sent through an acceleration tube. The accelerated ions bombard directly the portion of a silicon wafer where doping is required. The bombardment of the ion beam is usually conducted by scanning the beam or by rotating the wafer in order to achieve uniformity. A heavy layer of silicon dioxide or a heavy coating of a positive photoresist is used as the implantation mask. The depth of the dopant ions implanted can be determined by the energy possessed by the dopant ions, which is adjustable by changing the acceleration chamber voltage. The dosage level of the implantation, i.e., the number of dopant ions that enters into the wafer, is determined by monitoring the number of ions passing through a detector. As a result, a precise control of the junction depth planted in a silicon substrate can be achieved by adjusting the implantation energy, while a precise control of the dopant concentration can be achieved by adjusting the dosage level.

It is therefore an object of the present invention to provide a method for forming a copper conductor in an IC device that does not have the drawbacks and shortcomings of conventional copper conductor devices.

It is another object of the present invention to provide a method for forming a copper conductor in an electronic structure that has improved electromigration-resistance by adding impurities into the copper conductor.

It is a further object of the present invention to provide a method for forming a copper conductor in an electronic device that has improved electromigration-resistance property by doping the copper conductor structure with impurities selected from C, O, Cl, S and N.

It is another further object of the present invention to provide a method for forming a copper conductor in an electronic device that has improved electromigration resistance by an electrolytic plating technique.

It is still another object of the present invention to provide a method for forming a copper conductor in an electronic device that has improved electromigration resistance by first depositing a copper seed layer into a receptacle and then ion-implanting impurities into the seed layer.

It is yet another object of the present invention to provide a copper conductor in an electronic device that contains impurities for improved electromigration resistance.

It is yet another further object of the present invention to provide a method for forming a copper conductor in an electronic device that has improved electromigration resistance by first electro depositing a copper composition containing impurities into a receptacle and then annealing the electronic device such that impurities diffuse into a copper seed layer previously deposited in the receptacle.

It is still another further object of the present invention to provide a method for forming a copper conductor in an electronic device that has improved electromigration resistance by first depositing a barrier layer into a receptacle and then implanting dopant ions into the barrier layer prior to depositing a copper seed layer on top of the barrier layer and annealing the structure such that dopant ions diffuse into the copper seed layer.

It is yet another further object of the present invention to provide a method for forming a copper conductor in an electronic structure that has improved electromigration-resistance by first adding impurities into the copper conductor and then ion-implanting a surface layer of the conductor with at least one ion of Co, Al, Sn, In, Ti, C, O, Cl, S, N, or Cr.

SUMMARY OF THE INVENTION

In accordance with the present invention, a solution to the electromigration problem caused by thick copper seed layers is provided. The solution to achieve higher electromigration resistance in plated copper originates from the incorporation of dopants into a copper film during the plating process. The ideal dopants include, but not limited to, C, O, S, Cl and N. Other than the plating process, ion implantation may also be used to incorporate dopants in a copper film.

In a preferred embodiment, a method for forming a copper conductor in an electronic structure can be carried out by the steps of first providing an electronic structure, then forming a receptacle for a conductor in the electronic structure, then depositing a copper composition in the receptacle, and adding impurities into the copper composition such that its electromigration resistance is improved.

The method for forming a copper conductor having improved electromigration resistance may be carried out by depositing the copper composition by a technique of electroplating, physical vapor deposition or chemical vapor deposition. The impurities incorporated in the plating process or incorporated in the copper film by a separate ion implantation method may be at least one type of ions selected from the group consisting of C, O, Cl, S and N. The impurities can be added to the copper composition in a concentration range of between about 0.01 ppm by weight and about 1000 ppm by weight. The copper deposition step may further include the steps of depositing a copper seed layer into a receptacle, ion-implanting at least one type of impurities into the seed layer, and electrolytically plating copper into the receptacle. The seed layer may further be annealed to uniformly distribute the impurities in the layer. The deposition step for the copper composition may further include the steps of depositing a copper seed layer into the receptacle, electro-depositing a copper composition containing impurities into and filling the receptacle, and annealing the electronic structure such that impurities diffuse into the copper seed layer. The impurities are dopant ions.

The deposition step for the copper composition may further include the steps of depositing a barrier layer into the receptacle, implanting dopant ions into the barrier layer, depositing a copper seed layer on top of the barrier layer, and annealing the electronic structure such that dopant ions diffuse into the copper seed layer. The copper seed layer may be deposited by a physical vapor deposition technique or chemical vapor deposition technique. The method may further include the step of depositing a copper composition into and filling the receptacle. Such deposition step for the copper composition can be carried out by electroplating, physical vapor deposition or chemical vapor deposition.

In another preferred embodiment, the present invention method for forming a copper conductor in an electronic substrate can be carried out by the operating steps of first providing an electronic substrate, then forming a receptacle for a conductor in the electronic substrate, then depositing a copper seed layer into the receptacle, then ion-implanting at least one type of impurities into the seed layer, and depositing a copper composition in the receptacle.

The copper composition may be deposited into the receptacle by electrolytically plating copper into the receptacle. The method may further include the step of annealing the seed layer to uniformly distribute the impurities in the layer. The method may further include the steps of annealing the seed layer to uniformly distribute the impurities in the layer and to cause a diffusion of the impurities into the electrolytically plated copper. The copper composition can be deposited by a technique selected from the group consisting of electroplating, physical vapor deposition and chemical vapor deposition. The impurities may be at least one type of ions selected from the group consisting of C, O, Cl, S and N. The impurities can be added to the copper composition in a concentration range between about 0.01 ppm by weight and about 1000 ppm by weight.

In still another preferred embodiment, the present invention method for forming a copper conductor in an electronic structure can be carried out by the steps of first providing an electronic structure, then forming a receptacle for a conductor in the electronic structure, then depositing a copper seed layer into the receptacle, then electro-depositing a copper composition containing impurities into and filling the receptacle, and annealing the electronic structure such that the impurities diffuse into the copper seed layer.

The method for forming a copper conductor in an electronic structure may further include the step of implanting impurities which are dopant ions. The impurities can be at least one type of ions selected from the group consisting of C, O, Cl, S and N. The impurities are added to the copper composition in a concentration range between about 0.01 ppm by weight and about 1000 ppm by weight. The annealing step uniformly distribute the impurities in the copper composition.

In yet another preferred embodiment, the present invention method for forming a copper conductor in an electronic structure can be carried out by the steps of first providing an electronic structure, then forming a receptacle for a conductor in the electronic structure, then depositing a barrier layer into the receptacle and implanting dopant ions into the barrier layer, then depositing a copper seed layer on top of the barrier layer, and annealing the electronic structure such that dopant ions diffuse into the copper seed layer.

The method may further include the step of depositing a copper composition into and filling the receptacle. The copper composition may be deposited by a technique such as electroplating, physical vapor deposition or chemical vapor deposition. The dopant ions can be implanted into the barrier layer in a concentration range of between about 0.01 ppm by weight and about 1000 ppm by weight. The dopant ions are implanted into the barrier layer and diffused into the copper seed layer such that their electromigration resistance is improved.

In still another preferred embodiment, the present invention method for forming a copper conductor in an electronic structure that has improved electromigration-resistance which can be carried out by first adding impurities such as C, O, Cl, S or N into the copper conductor and then ion-implanting a surface layer of the conductor with at least one ion of Co, Al, Sn, In, Ti, C, O, Cl, S, N, or Cr. The surface layer may have a thickness between about 30 Å and about 500 Å, with a typical thickness of 200 Å. The advantages achieved by the dual-implantation process for further surface modification are the improvement of adhesion with subsequently deposited dielectric layers on top of the copper conductor, i.e., such as a nitride layer or an oxide layer; and a decrease in the copper surface diffusively by the formation of a copper complex or metal oxides that segregate to the surface. The metal ions chosen for the secondary surface implantation process have high affinity for oxygen such that the ions segregate to the copper interface (or surface) to form metal oxides as a protective layer for the copper conductor.

BRIEF DESCRIPTION OF THE DRAWINGS

These and other objects, features and advantages of the present invention will become apparent from the following detailed description and the appended drawings in which.

DETAILED DESCRIPTION OF THE PREFERRED AND ALTERNATE EMBODIMENTS

The present invention discloses a method for forming a copper conductor in an electronic structure by depositing a copper composition in a receptacle in the electronic structure and then adding impurities into the copper composition such that the electromigration resistance of copper is improved. The copper composition may be deposited by a variety of techniques such as electroplating, electroless plating, physical vapor deposition or chemical vapor deposition. The impurities or the dopant ions may be added to the copper composition through a variety of different methods. In one method, a copper seed layer may first be deposited into a receptacle, impurities are then ion-implanted into the seed layer followed by an electroplating process for depositing bulk copper into the receptacle. In another method, after a copper seed layer is first deposited into a receptacle, a bulk copper composition containing impurities is then electrodeposited into the receptacle. The electronic structure is then annealed such that impurities may diffuse into the copper seed layer. In still another method, a barrier layer such as barrier layer first deposited into a receptacle followed by an ion implantation process for implanting dopant ions into the barrier layer. A copper seed layer is then deposited on top of the barrier layer and then annealed such that dopant ions may diffuse from the barrier layer into the copper seed layer. The dopant ions utilized in the present invention may be at least one ion selected from the group consisting of C, O, S, Cl, Al, Co, Sn, In, Ti, Cr and N. The dosage of the impurities implanted into the copper composition is in a concentration range of between about 0.01 ppm by weight and about 1000 ppm by weight.

Figure 1:
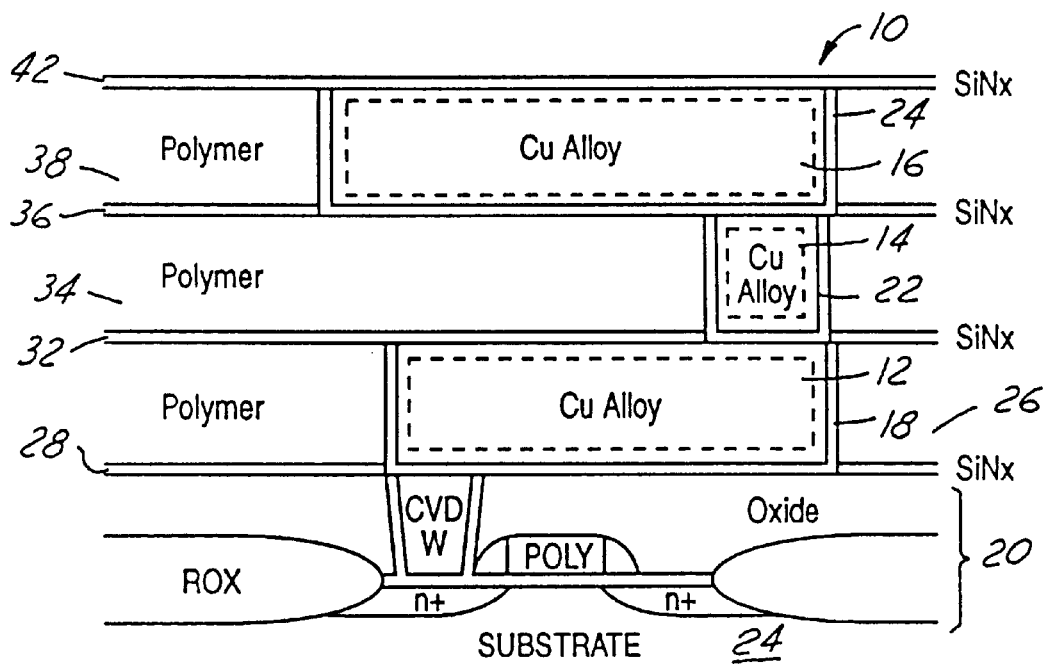
FIG. 1 is an enlarged, cross-sectional view of a conventional interconnection system utilizing copper alloy.
Figure 2:
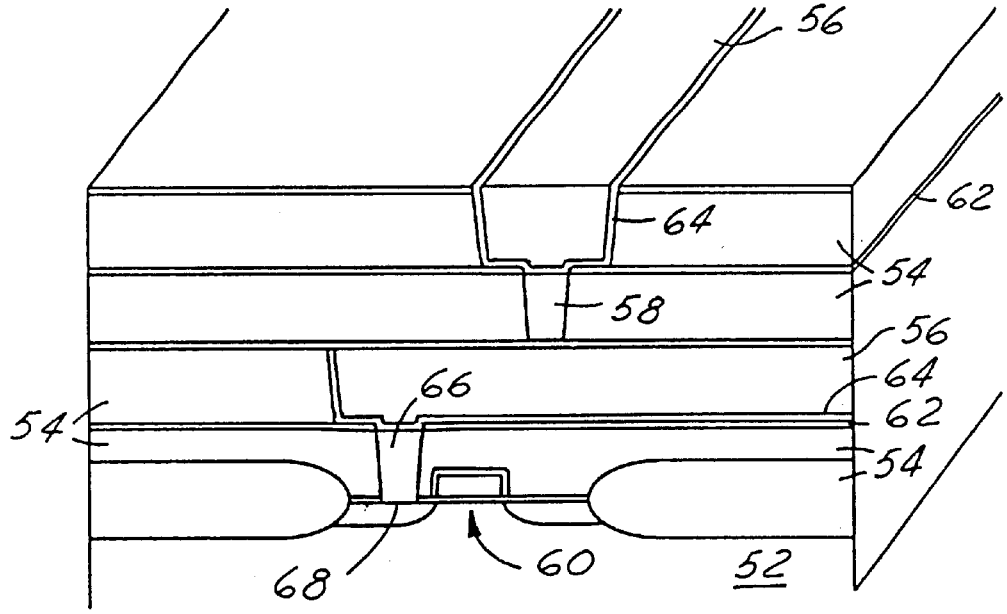
FIG. 2 is an enlarged, perspective view of a present invention copper interconnection structure.

Referring initially to FIG. 2, wherein an enlarged, perspective view of the present invention copper interconnection structure 50 is shown. The structure 50 is built on a silicon substrate 52. Multiple layers 54 of dielectric materials such as $SiO_2$ are then sequentially deposited with metal conductors formed therein. The metal conductor layers 56 are formed in the insulating layers 54 by standard photolithographic method. A via 58 is provided for connecting the metal conductor layers 56. A dielectric layer 62 formed of a material such as $Si_3N_4$ is provided as an etch stop layer. A diffusion barrier layer 64 is further provided to prevent the diffusion of dopant ions. Also shown in FIG. 2 is an IC device 60 and a tungsten stud or local interconnection 66 built on the semi-conducting substrate 52. The via 58 provides vertical connection between wiring levels 56 and is formed with copper while the tungsten stud 66 connects the wiring levels 56 to the device contact 68. The device 60 shown in FIG. 2 generally represents a CMOS transistor, but may be any other electronic device.

To prevent diffusion of copper into the insulators 54 or device 60, adhesion/diffusion barrier layers 64 are normally used to surround the copper conductors 56 and 58. The adhesion/diffusion barrier layers 64 may be formed of either an insulating material or of a conducting material. A conducting diffusion barrier layer may also provide adhesion for copper to the underlying material, even though they are simply referred to in this application as barrier layer. Not shown in FIG. 2 are the seed layers which are normally deposited under the main copper conductor layers 56 and 58. The deposition of the seed layers is described in reference to two different methods of fabricating the interconnection structures, i.e., in a single Damascene process and in a dual Damascene process. These are shown in FIGS. 3A–4B.

The present invention copper conductor structure which has improved electromigration resistance may be fabricated in one of several embodiments. In a preferred embodiment, dopant ions are incorporated in a seed layer by an ion-implantation process. Following a deposition process for the copper seed layer into a receptacle, various dopant ions may be implanted into the copper seed layer. An annealing step may then be carried out at an annealing temperature between about 300° C. and about 600° C. to uniformly distribute the dopant ions throughout the film thickness. An electrolytic plating process may then be used to deposit bulk copper composition into the receptacle. The method in the preferred embodiment therefore allows the improvement in the properties of the seed layer and is independent of the filling technique which is subsequently used to completely fill the lines and/or vias. The electrolytic plating process utilized in the present invention method is substantially disclosed in a co-pending application Ser. No. 08/768,107 filed on Dec. 16, 1996 under an commonly assigned to the assignee of the present invention. The application is hereby incorporated in its entirety by reference.

In the electrolytic plating process, the fabrication of a low cost, highly reliable copper interconnect structure for wiring in IC chips with void-free seamless conductors of sub-micron dimensions is possible. The process is normally carried out by first depositing an insulating layer on a wafer, lithographically defining and forming sub-micron trenches or holes in the insulating material into which the conductor will be deposited to ultimately form lines or vias, depositing a thin conductive layer to serve as a seed layer or plating base, depositing the conductor by electroplating from a bath containing additives and planarizing or chemical-mechanical polishing the resulting structure to accomplish electrical isolation of individual lines and/or vias.

The interconnection material may be copper electroplated from baths that contain additives. The rate of copper electroplating from such bath is higher in a deep section within the cavity than elsewhere. The plating process thus produces unique superfilling properties and results in void-free seamless deposits. Interconnection structures made by copper electroplated are highly electromigration-resistance with an activation energy for electromigration equal to or greater than 1.0 eV. The conductor is composed substantially of copper and small amounts of atoms and/or molecular fragments of C (<2 wt %), O (<1 wt %), N (<1 wt %), S (<1 wt %) and Cl (<1 wt %).

Figure 3A:
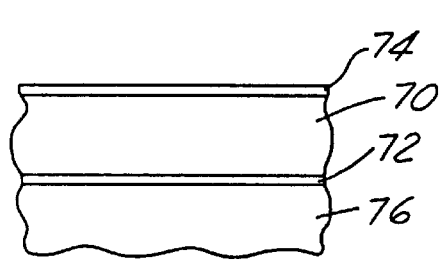
FIG. 3A is an enlarged, cross-sectional view of a structure for a single Damascene process wherein an insulating layer of either silicon oxide or a polymeric material is sandwiched by etch-stop and planarization layers of silicon nitride on top of a wafer.
Figure 3B:
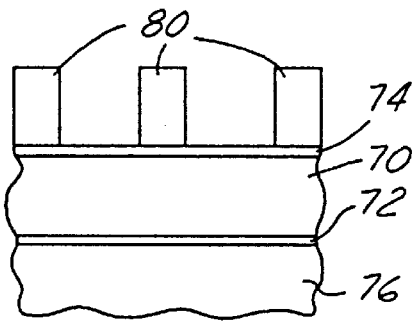
FIG. 3B is an enlarged, cross-sectional view of the structure of FIG. 3A with a resist pattern formed on top.
Figure 3C:
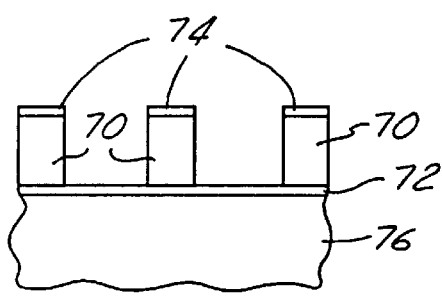
FIG. 3C is an enlarged, cross-sectional view of the structure of FIG. 3B with the insulating layer formed in an etching process and the resist layer removed.
Figure 3D:
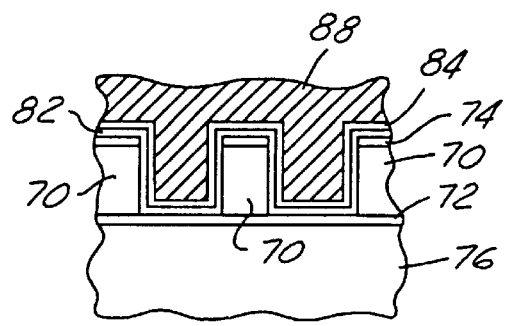
FIG. 3D is an enlarged, cross-sectional view of the structure of FIG. 3C with a barrier layer, a seed layer and a copper composition sequentially deposited into the receptacle.
Figure 3E:
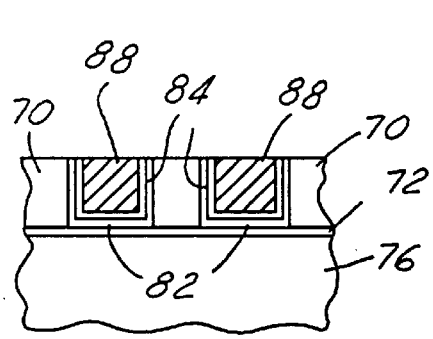
FIG. 3E is an enlarged, cross-sectional view of the structure of FIG. 3D after a planarization process.
Figure 3F:
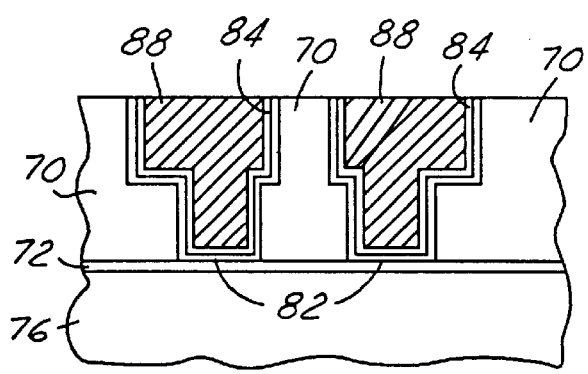
FIG. 3F is an enlarged, cross-sectional view of a dual Damascene structure formed by a similar process.

Referring now to FIGS. 3A~3F wherein a Damascene plating process is shown. A Damascene process is one in which plating is carried out over the entire wafer surface and is followed by a planarization process that isolates and defines the features. The plating process is preceded by the deposition of a plating base (or a seed layer) over the entire wiring pattern that has been defined lithographically. Material layers that improve adhesion and prevent conductor/insulator interactions and diffusion are deposited between the plating base and the insulator. As shown in FIGS. 3A~3F, an insulating layer 70 of either silicon oxide or a polymeric material which is sandwiched by etch-stop/planarization layers 72, 74 of silicon nitride is first deposited on a wafer 76. A resist pattern 80 is then formed on the sandwiched insulator and transferred to the insulator layer 72. A barrier material layer 82 and a seed layer (of copper) 84 are sequentially deposited on top of the structure. A copper layer 88 is then electroplated so that all features are filled. The structure is then processed to its final shape as shown in FIG. 3E by a planarization process. It is also possible to define lithographically multiple levels of patterns (i.e., in a dual Damascene structure) onto the insulator. This is shown in FIG. 3F wherein the same sequence of layer deposition is utilized.

In order to avoid the formation of a void or seam in a copper layer deposited electrolytically, the rate of electroplating should be higher at low or deep points within the feature than elsewhere. This is accomplished by the use of additives in the plating solution. Additives may induce in the conductor specific film microstructures including large grain size relative to film thickness or randomly oriented grains. Furthermore, additives incorporate in the conductor material molecular fragments containing atoms selected from the group consisting of C, O, N, S and Cl such that the electromigration resistance is enhanced over pure copper. Moreover, additives may be added to the bath for inducing in the conductor specific film microstructures including large grain size relative to film thickness or randomly oriented grains, whereby the electromigration behavior is enhanced over non-electroplated copper.

Figure 4A:
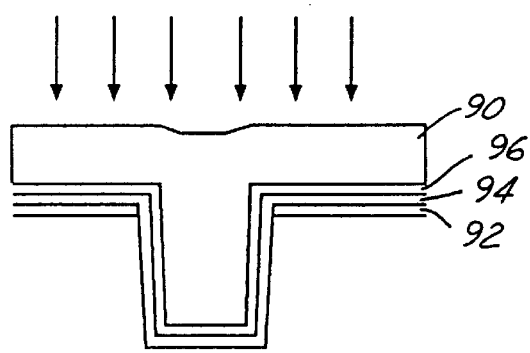
FIG. 4A is an enlarged, cross-sectional view of a portion of a dual Damascene structure with a copper layer deposited for the conductor.
Figure 4B:
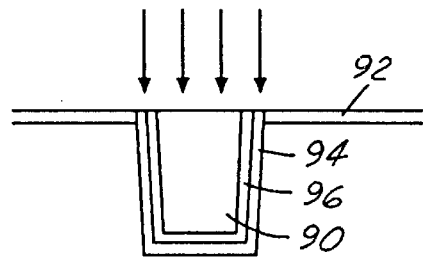
FIG. 4B is an enlarged, cross-sectional view of the structure shown in FIG. 4A with the copper conductor planarized.

Referring now to FIG. 4A, wherein a schematic diagram depicting ion implantation of dopants into a main copper conductor 90 in a single Damascene process prior to planarization is shown. Also shown in FIG. 4A are an etch-planarization stop layer 92 of silicon nitride, a barrier layer 94 and a copper seed layer 96. FIG. 4B is a schematic diagram depicting ion implantation of dopants into a main copper conductor 90 in a single Damascene process after a planarization step has been carried out.

Figure 5A:
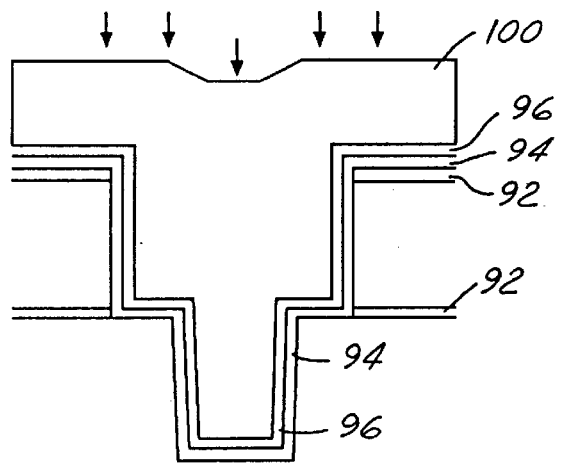
FIG. 5A is an enlarged, cross-sectional view of a structure formed by the present invention dual Damascene process with a copper seed layer and a barrier layer deposited wherein the seed layer and/or the diffusion barrier layer is ion implanted prior to copper deposition.
Figure 5B:
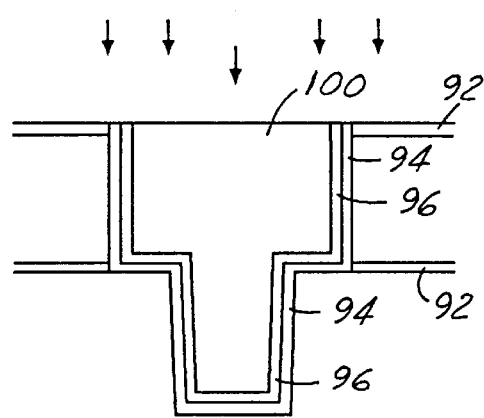
FIG. 5B is an enlarged, cross-sectional view of the structure of FIG. 5A with the copper conductor planarized.
Figure 6:
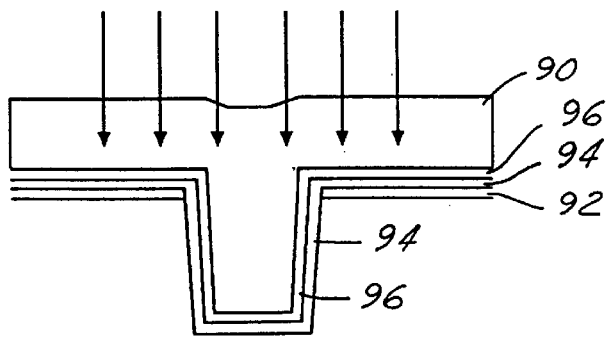

Referring now to FIG. 5A, wherein a schematic diagram depicting ion implantation of dopants into a main copper conductor 100 in a dual Damascene process prior to planarization. Also shown in FIG. 5A are etch/planarization stop layer 92 of silicon nitride, a diffusion barrier layer 94 and a copper seed layer 96. FIG. 5A shows a schematic diagram depicting ion implantation of dopant into a main copper conductor 100 in a dual Damascene process after a planarization step. FIG. 5B is an enlarged, cross-sectional view of the structure of FIG. 5A with the copper conductor planarized. FIG. 6 is a schematic diagram depicting ion implantation of dopants into a copper seed layer 96 and/or into a barrier layer 94 in a single Damascene process prior to the main copper conductor layer 90 deposition. Similarly, the ion implantation process may be carried out prior to the copper seed layer deposition by implanting ions into the diffusion barrier layer 94 alone.

In another preferred embodiment, the dopant levels in a plated film are defined taking into consideration the desired target of dopant concentrations in the final structure and the relative thicknesses of the plated or PVD films. The PVD seed layer can be first deposited and followed by electroplating copper under suitable processing conditions. The diffusion of dopant ions from the plated copper into the PVD seed layer can be accomplished by an annealing process.

In still another preferred embodiment, the dopant ions are implanted into a diffusion barrier layer prior to a PVD deposition process for the copper seed layer. An annealing process is then used to drive the dopants into the copper. Dopants other than the known non-metallic impurities in plated copper could also be used, i.e., Ti, Sn, In, etc. to improve the electromigration performance of the PVD seed layer. One advantage achieved by using ion implantation is the ability to incorporate very small amounts of solutes, i.e., a few ppm w, in a well controlled and repeatable manner.

In yet another preferred embodiment, the characteristics of copper formed by means other than plating can be improved. These other means may include, but is not limited to chemical vapor deposition or physical vapor deposition. The improvement in performance of these films can be achieved by means of ion implanting a diffusion barrier layer such as Ta, TaN, a seed layer, a cap layer or a thicker copper layer.

Chip interconnect structures made of plated copper have superior electromigration resistance when the plating process is conducted in plating solutions that contain additives which dope the plated metal with various dopants. The electromigration resistance of lines made of copper plated from solutions without additives, as well as the copper deposited by techniques such as PVD and CVD have been shown to be inferior. The dopants of interest include C, O, Cl, S and N in ranges from less than 0.0 ppm w (part per million by weight) to 1000 ppm w. These dopants are typically implanted at various energies ranging from a few keV to several hundred keV, for instance, from 10 keV to about 600 keV. The disribution and depth of dopant ions obtained can be calculated with computer programs such as TRIM®. It is noted that implanting doubly charged or even triply charged ions is possible which allows higher dopant distributions to be obtained in thicker metal film layers. Alternatively, repeated implantation may be conducted into various thick film layers in order to obtain the desired dopant distribution and depth. Dopants used in electroplated copper and the preferred range utilized are shown in Table 1.

TABLE 1

| Dopant | Preferred conc. (ppmw) | More preferred conc. (ppmw) |
| --- | --- | --- |
| Carbon | 0.1–1000 | 1–200 |
| Chlorine | 0.1–1000 | 1–200 |
| Oxygen | 0.1–200 | 1–50 |
| Sulfur | 0.01–100 | 0.1–50 |
| Nitrogen | 0.01–100 | 0.1–50 |

Well controlled dopant concentrations can be obtained in a number of different ways. For instance, dopant concentration may be controlled during deposition, dopant concentration may be controlled through the use of ion implantation of various dopants to different impurity levels and thicknesses in the film with various annealing process to redistribute dopants. It was discovered that ion implantation is a desirable method for achieving the present invention since the method is directional by nature and furthermore, the method may be repeated to achieve a well controlled dopant concentrations. It is thus possible to implant to the bottom of trenches which subsequently improves the plating process and furthermore, to implant onto the top of a chemical-mechanically polished copper surface which contributes to the improvement of electromigration resistance of the copper lines. This is important since the reliability of fine copper lines has been shown to decrease with decreasing line width.

Various other structures may also be achieved which include ion implanting into a liner, into seed layers and/or into filled copper structure itself. The ion implantation into narrow lines is important since the copper electromigration mechanism is driven by surface diffusion. The copper seed layer surface can be left as pure copper, while the species of interest can be ion implanted beneath this top copper surface region. This allows for the implanting process beneath the surface of the copper seed layer while, at the same time, doping the seed layer to improve its electrical properties.

The present invention novel method therefore provides the desirable dopant ions to be used in a suitable range of concentrations and furthermore, provides the optimum range that produces improved electromigration properties and various methods to change the dopant content in the film by changing plating parameters. For instance, dopant concentrations can be increased by increasing the level of agitation in the plating tool, e.g., increasing the rotational speed of the wafer during plating in a cup plater, or increasing the frequency of paddle movement in a paddle cell. Other parameters that play a role in defining the dopant levels in the film are the concentrations of additives and the deposition rate (or the current density).

Data obtained on electroplated copper layer at 1 μm thickness when no additives are used is shown in Table 2. Various dosages of dopant ions of C, S and Cl were utilized to achieve various dopant depth and changes in the sheet resistance. Similar data obtained on sputtered copper films at 1 μm thickness is shown in Table 3. It is seen that, in Tables 2 and 3, one can implant through the depth of up to 3000 Å for a single charged ion such as $^{12}C^+$, $^{32}S^+$ and $^{35}Cl^+$. In order to obtain a uniform profile of the ion through the thickness of the film, one needs to vary the ion charge of $^{12}C^{++}$, $^{32}S^{++}$ or $^{35}Cl^{++}$ at the same implantation energy level which effectively doubles the depth of implantation. If a more uniform profile is desired, one can vary both the ion charge and the energy of implantation. Table 2 shows that S and Cl have unexpected effects on copper causing a larger resistance drop than the control sample. Table 2 also shows data on plated copper with no additives in the planting bath so that the additives are only achieved by implantation.

Table 3 shows data obtained on 1 μm thick sputtered copper and doped with dopant ions (no plating). It was discovered that Cl and S are the most effective ions.

TABLE 2

| Sample # | Ion | E (keV) | Dosage, cm-2 | Depth (Å) | %R Drop |
| --- | --- | --- | --- | --- | --- |
| 1 | $^{12}C^+$ | 110 | 7.0E15 | 3200 | 4.5 |
| 2 | $^{12}C^{++}$ | 110 | 7.0E15 | 6400 | — |
| 3 | $^{32}S^+$ | 200 | 8.0E14 | 3000 | 11.5 |
| 4 | $^{32}S^{++}$ | 200 | 8.0E14 | 6000 | — |
| 5 | $^{35}Cl^+$ | 200 | 4.5E15 | 2400 | 13 |
| 6 | $^{35}Cl^{++}$ | 200 | 4.5E15 | 4800 | — |
| Control | None | — | — | — | 7 |

TABLE 3

| Sample # | Ion | E (keV) | Dosage, cm-2 | Depth (Å) | %R Drop |
| --- | --- | --- | --- | --- | --- |
| SP-1 | C-12 | 110 | 7.0E15 | 3200 | 3.5 |
| SP-5 | S-32 | 200 | 8.0E14 | 3000 | 8.5 |
| SP-9 | Cl-35 | 200 | 4.5E15 | 2400 | 9.4 |
| SP-11 | Cl-35 | 200 | 4.5E15 | 2400 | — |
| SP-13 | Control | — | — | — | 3.6 |
| SP-14 | Control | — | — | — | 4.2 |

Figure 7:
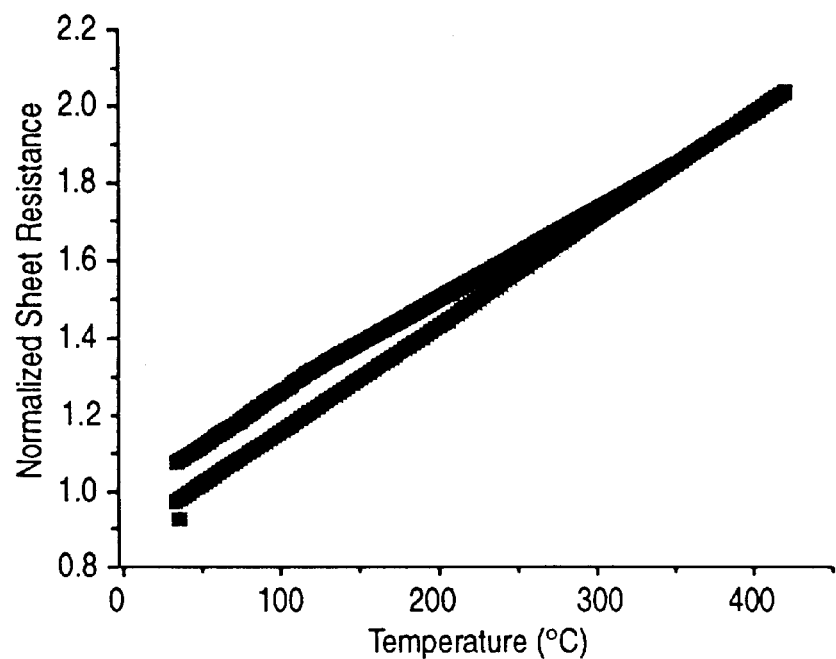
FIG. 7 is a graph illustrating the dependency of sheet resistance on plating temperatures in a copper plating process without utilizing additives in the plating solution.
Figure 8:
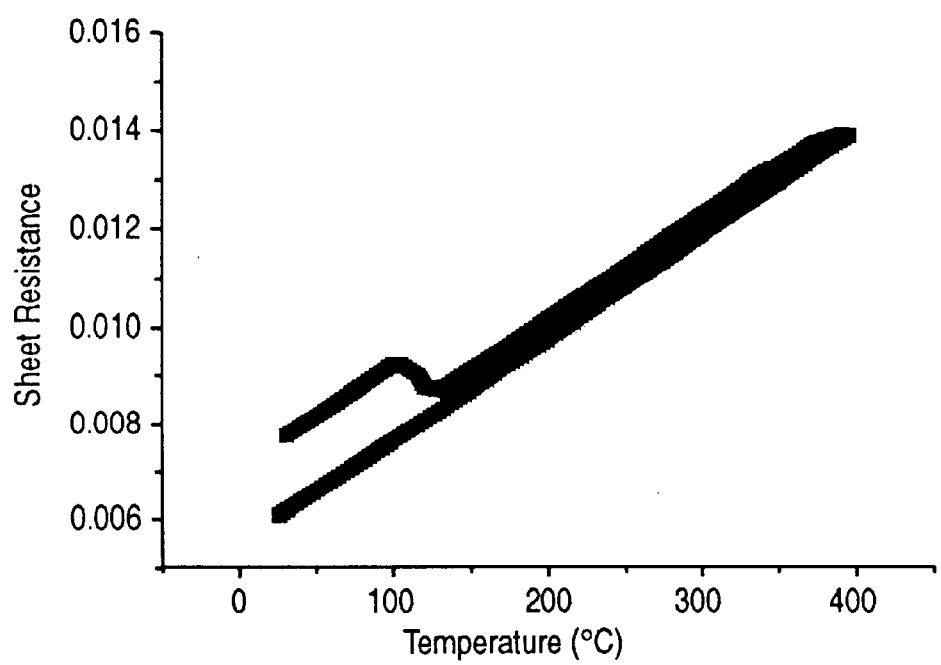
FIG. 8 is a graph illustrating the dependency of sheet resistance on plating temperatures in a copper plating process which utilizes additives in the plating solution.

Electroplated copper film data without additives and with additives are also presented in FIGS. 7 and 8. It is seen that FIG. 8 shows data on 1 μm thick plated copper with additives during plating, showing an abrupt drop in sheet resistance at approximately 125° C. FIG. 7 shows data for 1 μm thick plated copper with no additives, but implanted with S at 200 KeV and a dosage of 8E14/cm², showing a similar resistance drop in copper films with additives (FIG. 8) occurs over a much wider range in temperature, i.e., over approximately 300° C.

The present invention novel method may further be carried out in a dual-implantation process including a secondary surface modification step of ion-implantation into a surface layer with at least one metal ions selected from Co, Al, Sn, In, Ti or Cr to a depth between about 30 Å and about 500 Å, preferably between about 100 Å and about 300 Å, with an average depth at about 200 Å. The modified surface layer is situated on top of the copper conductor which has a thickness of about 1 μm and contains impurities of C, N, O, Cl or S. The secondary surface modification by the ion-implantation process accomplishes two objectives. First, it improves the adhesion of the copper layer with a subsequently deposited dielectric layer on top of the copper conductor, i.e., a nitride layer, an oxide layer or a polymeric material. Secondly, the surface modification process decreases the copper surface diffusively by forming a copper complex or metal oxides that segregate to the surface in a thin layer of approximately 200 Å. The metal ions of Co, Al, Sn, In, Ti, or Cr are chosen for their affinity for oxygen. The metal ions segregate to the copper interface (or surface) and thus forming metal oxides as a protective layer for the bulk copper conductor.

Table 4 illustrates data on the metal ions used in the surface modification of the copper conductor.

TABLE 4

| Implantation Energy | Metal Ion | Atomic Mass | Thickness, (Å) | Dosage, Atom/cm$^2$ |
|---|---|---|---|---|
| 90 keV | Ti | 47.95 | 317 | 3E15 |
| 50 keV | Al | 26.98 | 313 | 3E15 |
| 180 keV | Sn | 119.9 | 295 | 3E15 |
| 180 keV | In | 114.9 | 299 | 3E15 |

While the present invention has been described in an illustrative manner, it should be understood that the terminology used is intended to be in a nature of words of description rather than of limitation.

Furthermore, while the present invention has been described in terms of a preferred and an alternate embodiment, it is to be appreciated that those skilled in the art will readily apply these teachings to other possible variations of the inventions.

The embodiment of the invention in which an exclusive property or privilege is claimed are defined as follows:

1. A method for forming a copper conductor in an electronic structure comprising the steps of:
   providing an electric structure,
   forming a receptacle for a conductor in said electronic structure,
   depositing a copper composition in said receptacle, and
   adding at least one non-metallic impurities into said copper composition such that its electromigration resistance is improved.

2. A method for forming a copper conductor in an electronic structure according to claim 1, wherein said copper composition is deposited by a technique selected from the group consisting of electroplating, electroless plating, physical vapor deposition and chemical vapor deposition.

3. A method for forming a copper conductor in an electronic structure according to claim 1, wherein said impurities are at least one type of ions selected from the group consisting of C, O, Cl, S and N.

4. A method for forming a copper conductor in an electronic structure according to claim 1, wherein said impurities are added to said copper composition in a concentration range between about .01 ppm by weight and about 1000 ppm by weight.

5. A method for forming a copper conductor in an electronic structure according to claim 1, wherein said copper composition deposition step further comprises:
   depositing a copper seed layer into said receptacle,
   ion-implanting at least one type of impurities into said seed layer, and
   electrolytically plating copper into said receptacle.

6. A method for forming a copper conductor in an electronic structure according to claim 5 further comprising the step of annealing said seed layer.

7. A method for forming a copper conductor in an electronic structure according to claim 1, wherein said deposition step for said copper composition further comprises the steps of:
   depositing a copper seed layer into said receptacle,
   electro depositing a copper composition containing impurities into and filling said receptacle, and
   annealing said electronic structure.

8. A method for forming a copper conductor in an electronic structure according to claim 1, wherein said deposition step for said copper composition further comprises the steps of:
   depositing a barrier diffusion layer into said receptacle,
   implanting dopant ions into said barrier layer,
   depositing a copper seed layer on top of said barrier layer, and
   annealing said electronic structure.

9. A method for forming a copper conductor in an electronic structure according to claim 8, wherein said copper seed layer is deposited by a physical vapor deposition technique.

10. A method for forming a copper conductor in an electronic structure according to claim 8 further comprising the step of depositing a copper composition into and filing said receptacle.

11. A method for forming a copper conductor in an electronic structure comprising the steps of:
    providing an electronic structure,
    forming a receptacle for a conductor in the electronic structure,
    depositing a copper seed layer into the receptacle,
    ion-implanting at least one type of non-metallic impurities into the seed layer, and
    depositing a copper composition in said receptacle.

12. A method for forming a copper conductor in an electronic structure according to claim 11 further comprising the step of annealing the seed layer.

13. A method for forming a copper conductor in an electronic structure according to claim 11 further comprising the steps of annealing said seed layer to uniformly distribute the impurities in the layer and to cause a diffusion of the impurities into the electrolytically plated copper.

14. A method for forming a copper conductor in an electronic structure according to claim 11, wherein said copper composition is deposited by a technique selected from the group consisting of electroplating, electroless plating, physical vapor deposition and chemical vapor deposition.

15. A method for forming a copper conductor in an electronic structure according to claim 11, wherein said impurities are at least one type of ions selected from the group consisting of C, O, Cl, S and N.

16. A method for forming a copper conductor in an electronic structure according to claim 11, wherein said impurities are added to the copper composition in a concentration range between about 0.01 ppm by weight and about 1000 ppm by weight.

17. A method for forming a copper conductor in an electronic structure comprising the steps of:
    providing an electronic structure,
    forming a receptacle for a conductor in the electronic structure, depositing a copper seed layer into the receptacle, electro depositing a copper composition containing nonmetallic impurities into the receptacle, and annealing the electronic structure.

18. A method for forming a copper conductor in an electronic structure according to claim 17, wherein said impurities are at least one type of ions selected from the group consisting of C, O, Cl, S and N.

19. A method for forming a copper conductor in an electronic structure according to claim 17, wherein said impurities are added to the copper composition in a concentration range between about 0.01 ppm by weight and about 1000 ppm by weight.

20. A method for forming a copper conductor in an electronic structure according to claim 17, wherein said annealing step uniformly distributes the impurities.

21. A method for forming a copper conductor in an electronic structure comprising the steps of:

providing an electronic structure, forming a receptacle for a conductor in the electronic structure, depositing a barrier layer into the receptacle, implanting dopant ions into the barrier layer, depositing a copper seed layer on top of the barrier layer, and annealing the electronic structure such that dopant ions diffuse into the copper seed layer.

22. A method for forming copper conductor in an electronic structure according to claim 21 further comprising the step of depositing a copper composition into and filling the receptacle.

23. A method for forming a copper conductor in an electronic structure according to claim 22, wherein the copper composition is deposited by a technique selected from the group consisting of electroplating, electroless plating physical vapor deposition and chemical vapor deposition.

24. A method for forming a copper conductor in an electronic structure according to claim 21, wherein said copper seed layer is deposited by a physical vapor deposition technique.

25. A method for forming a copper conductor in an electronic structure according to claim 21, wherein said dopant ions implanted into said barrier layer in a concentration range of between about 0.01 ppm by weight and about 1000 ppm by weight.

26. A method for forming a copper conductor in an electronic structure according to claim 21, wherein said dopant ions are implanted into said barrier layer and diffused into said copper seed layer such that their electromigration resistance is improved.

27. A method for forming a copper conductor in an electronic structure comprising the steps of:

providing an electronic structure, forming a receptacle for a conductor in the electronic structure, depositing a copper seed layer into the receptacle, electro depositing a copper composition containing nonmetallic impurities into the receptacle forming said conductor, planarizing said copper conductor, and ion-implanting at least one metal ion into a surface layer of said copper conductor.

28. A method for forming a copper conductor in an electronic structure according to claim 27 further comprising the step of annealing said electronic structure after said ion-implanting step.

29. A method for forming a copper conductor in an electronic structure according to claim 27, wherein said impurities are at least one type of ion selected from the group consisting of C, O, Cl, S and N.

30. A method for forming a copper conductor in an electronic structure according to claim 27, wherein said impurities are added to the copper composition in a concentration range between about 0.01 ppm by weight and about 1000 ppm by weight.

31. A method for forming a copper conductor in an electronic structure according to claim 27, wherein said at least one metal ion is selected from the group consisting of Co, Al, Sn, In, Ti and Cr.

32. A method for forming a copper conductor in an electronic structure according to claim 27, wherein said surface layer of said copper conductor having the at least one metal ion implanted has a thickness between about 30 Å and about 500 Å.

* * * * *

UNITED STATES PATENT AND TRADEMARK OFFICE
CERTIFICATE OF CORRECTION

PATENT NO.    : 6,268,291 B1                                              Page 1 of 1
DATED         : July 31, 2001
INVENTOR(S)   : Panayotis Constantinou Andricacos et al.

It is certified that error appears in the above-identified patent and that said Letters Patent is hereby corrected as shown below:

Drawings,
Figure 6 is a schematic diagram depicting ion implantation of dopants into a copper seed layer and a barrier layer in a single Damascene process prior to the main copper conductor layer deposition.

Signed and Sealed this

Seventh Day of October, 2003

JAMES E. ROGAN
*Director of the United States Patent and Trademark Office*

UNITED STATES PATENT AND TRADEMARK OFFICE
CERTIFICATE OF CORRECTION

| | | |
|---|---|---|
| PATENT NO. | : 6,268,291 B1 | Page 1 of 1 |
| APPLICATION NO. | : 09/204185 | |
| DATED | : July 31, 2001 | |
| INVENTOR(S) | : Andricacos et al. | |

It is certified that error appears in the above-identified patent and that said Letters Patent is hereby corrected as shown below:

In column 1 lines 7 – 10, replace

"This application is cross-referenced to Ser. No. 08/768,107, filed Dec. 16, 1996 by P.C. Andricacos et al, which is directed to electroplated Cu wiring on integrated circuit chips"

with

"This application is a continuation-in-part of Ser. No. 08/768,107, filed Dec. 16, 1996 by P.C. Andricacos et al. and is now abandoned, which is a continuation-in-part of Ser. No. 08/670,200 filed on June 21, 1996 by P.C. Andricacos et al. and is now abandoned, which claims priority to provisional application Ser. No. 60/009,538 filed on Dec 29, 1995."

In claim 1, please replace "an electric" with "said electronic"

Signed and Sealed this
Ninth Day of October, 2012

David J. Kappos
*Director of the United States Patent and Trademark Office*